United States Patent
Eberhard et al.

(10) Patent No.: US 10,282,115 B2
(45) Date of Patent: *May 7, 2019

(54) OBJECT SYNCHRONIZATION IN A CLUSTERED SYSTEM

(71) Applicant: International Business Machines Corporation, Armonk, NY (US)

(72) Inventors: Ralf Eberhard, Kelsterbach (DE); Erik Rueger, Ockenheim (DE); Rolf Schaefer, Mainz (DE); Frank B. Schmuck, Campbell, CA (US)

(73) Assignee: International Business Machines Corporation, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 15/486,405

(22) Filed: Apr. 13, 2017

(65) Prior Publication Data
US 2018/0300068 A1 Oct. 18, 2018

(51) Int. Cl.
G06F 12/00 (2006.01)
G06F 3/06 (2006.01)
G06F 17/30 (2006.01)
H03M 13/09 (2006.01)

(52) U.S. Cl.
CPC .......... G06F 3/0619 (2013.01); G06F 3/065 (2013.01); G06F 3/067 (2013.01); G06F 17/30575 (2013.01); H03M 13/093 (2013.01)

(58) Field of Classification Search
CPC ........ G06F 3/0619; G06F 3/067; G06F 3/065; G06F 17/30575; H03M 13/093
See application file for complete search history.

(56) References Cited

U.S. PATENT DOCUMENTS

| 5,842,216 A | 11/1998 | Anderson et al. |
| 6,188,695 B1 * | 2/2001 | Przybysz ............. H04Q 3/0029 370/410 |
| 6,996,584 B2 | 2/2006 | White et al. |
| 7,328,322 B2 | 2/2008 | White et al. |
| 8,786,473 B2 | 7/2014 | Samuels et al. |
| 9,020,912 B1 | 4/2015 | Majee et al. |
| 9,330,271 B1 | 5/2016 | Shams et al. |

(Continued)

FOREIGN PATENT DOCUMENTS

WO 2016063461 A1 4/2016

OTHER PUBLICATIONS

Accelerated Examination Support Document, U.S. Appl. No. 15/883,547, signed Jan. 30, 2018, 21 pgs.

(Continued)

*Primary Examiner* — David Yi
*Assistant Examiner* — Alan Otto
(74) *Attorney, Agent, or Firm* — Jared L. Montanaro

(57) ABSTRACT

A storage system in a clustered system may receive a first input/output (I/O) request. The storage system may include one or more storage nodes. Each of the one or more storage nodes may have a copy of a particular object stored thereon. The storage system may execute the first I/O request. Executing the first I/O request may modify data of a first object in a first storage node. The first object may be a copy of the particular object. The storage system may transfer the modified data of the first object to a master storage node. The master storage node may include a master object update descriptor list.

14 Claims, 6 Drawing Sheets

(56) References Cited

U.S. PATENT DOCUMENTS

| | | | |
|---|---|---|---|
| 2010/0205147 A1* | 8/2010 | Lee .................. | G06F 17/30575 707/620 |
| 2014/0108760 A1 | 4/2014 | Helin et al. | |
| 2015/0242478 A1 | 8/2015 | Cantwell et al. | |
| 2016/0044108 A1* | 2/2016 | Vermeulen ........ | G06F 17/30212 709/218 |
| 2016/0062836 A1 | 3/2016 | Mu et al. | |

OTHER PUBLICATIONS

Eberhard et al., "Object Synchronization in a Clustered System," U.S. Appl. No. 15/883,547, filed Jan. 30, 2018.

List of IBM Patents or Patent Applications Treated as Related, Jan. 30, 2018, 2 pgs.

NetApp, "Clustered Data ONTAP® 8.3," System Administration Guide for Cluster Administrators, Mar. 2015, p. 209, 372 pgs., https://library.netapp.com/ecm/ecm_get_file/ECMP1636037.

MicroStrategy, "Server," TN6022: MicroStrategy Intelligence Server Cluster Configuration Guide—MicroStrategy Community, https://community.microstrategy.com/t5/tkb/articleprintpage/tkb-id/server/article-id/101, 12 pages, Aug. 19, 2016.

Mell et al., "The NIST Definition of Cloud Computing," Recommendations of the National Institute of Standards and Technology, U.S. Department of Commerce, Special Publication 800-145, Sep. 2011, 7 pgs.

* cited by examiner

OBJECT SYNCHRONIZATION IN A CLUSTERED SYSTEM

BACKGROUND

The present disclosure relates generally to the field of object synchronization, and more specifically to limiting the impact updating a node in a clustered system through synchronization has on workload and physical storage.

A read or a write input/output (I/O) operation of an object from a clustered system connected by a network may result in a high workload on a storage system in the clustered system that updates the object for every read and/or write I/O operation. The I/O operations may additionally affect the network connecting clustered system. This may result in slow performance and increased hardware costs associated with the storage system and the network when constant updating is performed.

SUMMARY

Embodiments of the present invention disclose a method, system, and computer program product for synchronizing a single object in a single node in a clustered system. A storage system in a clustered system may receive a first input/output (I/O) request. The storage system may include one or more storage nodes. Each of the one or more nodes may have a copy of a particular object stored thereon. The storage system may execute the first I/O request. Executing the first I/O request may modify data of a first object in a first storage node. The first object may be a copy of the particular object. The storage system may transfer the modified data of the first object to a master storage node. The master storage node may include a master object update descriptor list.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
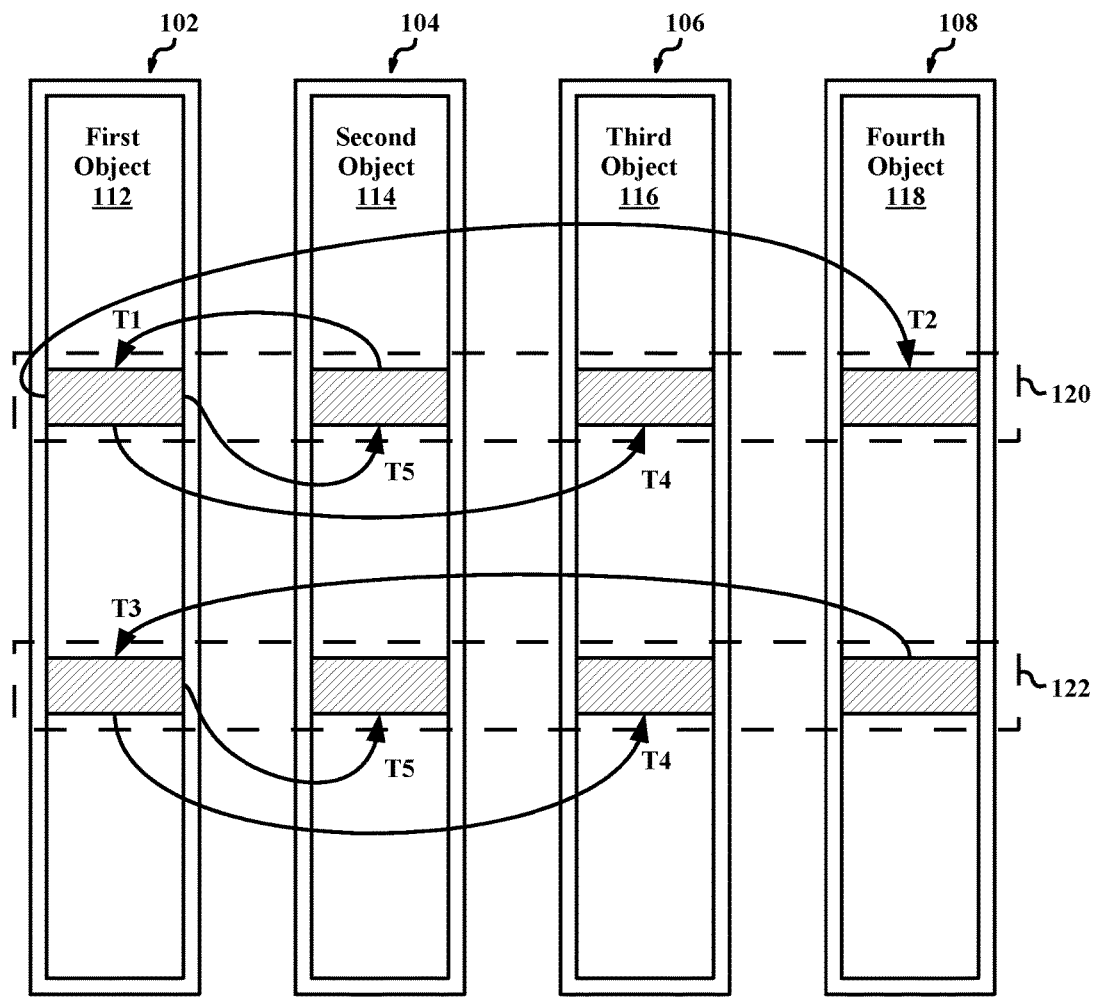
FIG. 1 illustrates an example distributed system for updating individual nodes at a specific time, in accordance with embodiments of the present disclosure.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the invention.

DETAILED DESCRIPTION

Aspects of the present disclosure relate generally to the field of object synchronization, and more specifically to limiting the impact updating a node in a clustered system through synchronization has on workload and physical storage. While the present disclosure is not necessarily limited to such applications, various aspects of the disclosure may be appreciated through a discussion of various examples using this context.

Many devices (e.g., computers, mobile phones, music players, etc.) may be connected by a network, and read/write input/output (I/O) operations of an object shared by the many devices and updated in one of the many devices may cause a high workload on a back-end storage unit (e.g., storage system, server, storage subsystem, etc.). The high workload may occur because the back-end storage unit may update all nodes within the back-end storage unit to ensure that all devices are properly synchronized with the updated shared object after the one device has altered the shared object. The high workload may result in slow performance of the back-end storage unit and network, and/or high costs for physical hardware capable of processing the I/O operations. A user may desire to update a single node at a time as the back-end storage unit receives an I/O operation in order to reduce the processing effort of the back-end storage unit.

In some embodiments, a storage system (e.g., the back-end storage unit) in a clustered system (e.g., a system that may include one or more devices connected to and by a network) may receive a first I/O request. In some embodiments, the storage system may include one or more storage nodes. In some embodiments, each of the one or more storage nodes may have a copy of a particular object stored thereon. The storage system may execute the first I/O request. In some embodiments, the first I/O request (e.g., a write I/O request) may modify data of a first object in the first storage node. In some embodiments, the first object may be a copy of the particular object. In some embodiments, each object hereinafter discussed (e.g., first, second, third, fourth, etc.) may be a copy of the particular object. The storage system may transfer the modified data of the first object to a master storage node. In some embodiments, the master storage node may include a master object update descriptor list. In some embodiments, the master update descriptor list may reduce inter-cluster communication by allowing each node in the clustered system to update only the changed data located in the list instead of having to replace all data on the node.

For example, a computer, a cellphone, and a tablet may be connected via the same network to a remote server (e.g., the computer, cellphone, tablet and server makeup the clustered system). The remote server may house (e.g., store) a shared document (e.g., the first object) that a user is working on. As the user is waiting to go to work, the user may put a picture in the shared document using the tablet. The tablet may send a write I/O request to the remote server asking the server to modify the shared document with the picture. The remote server may identify that the shared document for the tablet is stored in a specific storage node and execute the write I/O request; updating the shared document. The remote server may then transfer the modified data (e.g., the picture) to a master storage node and update a list detailing that the shared document was updated with the picture. The other versions of the shared document (e.g., those stored in nodes related to the computer and the cell phone) may not be automatically updated. Instead, each of the other nodes may be updated when the user attempts to access the data stored on those other nodes (e.g., when he performs a read I/O request using his computer). In some embodiments, this may improve the processing speed of the storage system by allowing the other devices in the clustered system to be individually updated as requests for access to the shared document arise, instead of automatically pushing updates to all nodes in the system at the same time, even if some of the nodes are not in use and do not need the update immediately.

In some embodiments, the storage system may receive a second I/O request. In some embodiments, the second I/O request may read data of a second object in a second storage node. The storage system may push, from the master storage node, the modified data to the second storage node. The storage system may update the second object with the modified data from the master storage node. The storage system may then execute the second I/O request. In some embodiments, the second object may be the same object as the first object.

Following the example above, the user may make it to work and turn on the computer. The user may choose to open the shared document, and the computer may send a request to the remote server asking for access to the shared document. The remote server may identify a specific node that holds the shared document for the computer. The remote server may identify, from the list, that the tablet has updated the shared document. The remote server may update the shared document on the specific node that holds the shared document for the computer. The remote server may then execute the request to open the shared document with the shared document on the computer updated with the picture.

In some embodiments, the storage system may receive a third I/O request. In some embodiments, the third I/O request may modify (e.g., because the third I/O request is a write request) data of a third object in a third storage node. The storage system may request the modified data from the master storage node. The storage system may compare the modified data from the master storage node to the modified data of the third I/O request. The storage system may determine, based on the comparing, one or more differences between the modified data from the master storage node and the modified data of the third I/O request. The storage system may update the third object with the one or more differences (e.g., the differences between the modified data from the master storage node and the modified data of the third I/O request). The storage system may then execute the third I/O request. In some embodiments, the third object may be the same object as the first object and the second object.

Again, following the example above, the user may be out at lunch and receive an urgent message requesting a change to the shared document. The user may open the shared document (e.g., with the picture changed by following the example aforementioned with regard to the second I/O request) on the cellphone, and make the requested change. The remote server may receive the requested change from the cellphone, and, before storing the requested change, ask the master storage node for any data that may have been modified on the shared document before. The remote server may compare the information stored on the master storage node to the requested change and identify differences between the stored information and the requested change. The remote server may then save only the differences between the requested change and the stored information.

While the examples above describe each user device (e.g., computer and tablet) being associated with a different node, that may not always be the case. For example, in some embodiments each device is capable of accessing data from each node. The node that is used may depend on, for example, the network traffic (e.g., available bandwidth) to the nodes, the number of requests that the nodes are currently processing, the geographic location of the nodes, the urgency of the requests, the type(s) of hardware used by the nodes, user preference, random or otherwise algorithmic selection, etc. The present disclosure should not be limited by the above examples.

In some embodiments, when transferring the modified data of the first object to the master storage node, the storage system may receive a notification from the first storage node that data of the first object has been modified. The storage system may compare original data on the master storage node to the modified data of the first object. The storage system may identify one or more differences between the original data and the modified data of the first object. The storage system may then store the one or more differences in the master object update descriptor list.

In some embodiments, when comparing the original data on the master storage node to the modified data of the first object, the storage system may also calculate a cyclic redundancy check (CRC) sum, a starting point, and a length of the modified data area of the first object. The storage system may store the CRC sum, the starting point, and the length of the modified data area of the first object permanently to a first object descriptor list (e.g., the CRC sum, starting point, and the length may be stored on the list as a triple data entity). The storage system may then send the CRC sum, the starting point, and the length of the modified data area of the first object to the master storage node for synchronization.

In some embodiments, the storage system may continue to calculate a master CRC sum, a master starting point, and a master length of the modified data area of the master object. The storage system may compare the master CRC sum to the CRC sum, the master starting point to the starting point, and the master length to the length of the modified data area of the first object. The storage system may identify one or more differences between the master CRC sum and the CRC sum, the master starting point and the starting point, and the master length and the length of the modified data area of the first object. The storage system may then store the one or more differences in the master object update descriptor list.

For example, an external hard drive, or a processor/controller that controls the external hard drive, may receive a notification that a picture has been altered to reduce red eye. The external hard drive may calculate a CRC sum indicating a change has been made to the picture (e.g., a CRC sum of remainder 3 based on 32-bit encoding). The external hard drive may continue to locate the starting point of the altered picture (e.g., the red eyes were changed 3 units right of the origin of the picture) and a length of the picture with the alteration (e.g., the picture with the red eye reduction takes up 2.3 Mb).

The external hard drive may store the CRC sum, the starting point of the red eye alteration, and the size of the red eye alteration (e.g., as a single, triple data entity) in a list designated for the picture that details changes to the picture. The external hard drive may then send the CRC sum, the starting point, and the length of the alteration to a master storage node in the external hard drive that houses the original version of the picture (e.g., that includes the red eye). The external hard drive may calculate a master CRC sum for the original version of the picture indicating that the picture has not been altered (e.g., a CRC sum of remainder 2 based on 32-bit encoding). The external hard drive may additionally identify a starting point of the original version of the picture (e.g., an origin point of 0) and a master length of the original version of the picture (e.g., the 1.8 Mb).

The external hard drive may compare the master CRC sum to the CRC sum of the altered picture, and determine that there is a difference of 1. This may indicate to the external hard drive that the master node does not contain the same data as the node holding the altered picture and that the master node may need updated. The external hard drive may continue to compare the starting points, and identify the area 3 units to the right of the origin of the original version of the picture has been altered. The external hard drive may then continue to identify through comparison that the altered picture is 0.5 Mb larger than the original. The external hard drive may recognize the differences, and store the enhanced red eye area of the picture in the master storage node (e.g., the external hard drive does not store the entire altered picture, only the area that was effected by the change in red eye).

In some embodiments, the storage system may determine, in response to comparing the modified data from the master storage node to the modified data of the third I/O request, that the modified data from the master storage node exceeds a threshold number of changes. The storage system may then copy all data from the master storage node to the third object. In some embodiments, all the data may include the modified data on the master storage node.

For example, a storage system may identify that a music file shared by five computers has been updated by one of the computers. The storage system may be set to completely update the song in a master storage node if the song has more than 3 updates. The computer may compare the original music file in the master node to the updated music file and identify that the drums have been altered to have a faster beat, that the guitar in a different chord, and the singer is now baritone. With the three changes identified, the storage system may determine to store the entire version of the updated music file by copying the updated music file from the one computer. (e.g., this is opposed to copying the individual changes to the music file).

Referring now to FIG. 1, illustrated is an example distributed system 100 for updating individual nodes at a specific time, in accordance with embodiments of the present disclosure. In some embodiments, the distributed system may be specialized for a specific purpose and become a clustered system. In some embodiments, the distributed system 100 may include a first node 102 (e.g., a master node), a second node 104, a third node 106, and a fourth node 108. In some embodiments, the first node 102 may include a first object 112 (e.g., a master object), the second node 104 may include a second object 114, the third node 106 may include a third object 116, and the fourth node 108 may include a fourth object 118.

In some embodiments, the first object 112, the second object 114, the third object 116, and the fourth object 118 may be the same object (e.g., the objects are logically the same, but may differ during different times/steps of the updating process; the objects may collectively be referred to as an overall object). In some embodiments, the first node 102 (e.g., the master node) may be a term used to describe a part of each of the nodes 104-108 that controls the synchronization of updates to the objects 114-118 (e.g., the first node 102 is a partitioned portion of each node which holds updated data of the objects 114-118).

In some embodiments, the distributed system 100 may begin processing data at time T0. At time T0, all the objects 112, 114, 116, and 118 may be the same object (i.e. copies of the same object on different nodes). After time T0, the distributed system 100 may process, on the second node 104, changes to the second object 114 at a time T1. In some embodiments, the change may occur via a write request. In some embodiments, the affected area of the second node 104 may mark the change as changed area 120. In some embodiments, the changed area 120 may be marked on each node 102, 104, 106, and 108 because each object 112-118 in the nodes 102-108 is the same object, therefore each object may need the update from changed area 120.

In some embodiments, the second node 104 may evaluate the changed area 120 by using a delta compression algorithm (e.g., delta encoding, symmetric delta, directed delta, etc.). In some embodiments, the second node 104 may calculate a CRC sum, a starting point, and a length of the changed area 120 of the second object 114, storing the three calculated values as a triple data entity. The second node 104 may permanently store the triple data entity to a second object update descriptor list. The triple data entity may be sent to the first node 102. The first node 102 may receive the triple data entity (CRC sum, starting point, and length of the changed area 120) from the second node 104 and permanently save the triple data entity in a first object update descriptor list (e.g., a master object update descriptor list). In some embodiments, each node may contain its own object update descriptor list.

The first node 102 may calculate the CRC sum of the first object 112 (e.g., its own object), based on the triple data entity received from the second node 104. In some embodiments, both CRC sums (e.g., the CRC sum of the second object 114 and the CRC sum of the first object 112 during T1) may be different and hence the first node 102 identifies that it may need the changed data of the changed area 120 from the second node 104. In some embodiments, the first node 102 may request the changed data of the changed area 120 from the second node 104 and, once the changed data is received, the first node 102 may merge the changed data to the first object 112. After merging the changed data, the first object 112 on the first node 102 and the second object 114 on the second node 104 may be the same.

In some embodiments, after the time T1, the distributed system 100 may, at a time T2, process a read I/O request to read the fourth object 118 on the fourth node 108. The fourth node 108 may send a request to the first node 102 to get the latest first update descriptor list of the first object 112. The first node 102 may return the first update descriptor list, which may have been updated during the time T1 for the changed area 120, to the fourth node 118. In some embodiments, the fourth node 118 may store the received first update descriptor list (e.g., it may store the changes in its own update descriptor list).

In some embodiments, the fourth node 118 may compare a fourth update descriptor list (e.g., its own update descriptor list) with the first update descriptor list received from the first node 102. The fourth node 108 may identify, in response to the comparing, that a new data entity for the changed area 120 exists. The fourth node 108 may calculate a third CRC sum of the fourth object 118 based on the new data entity received from the first node 102 for the changed area 120. In some embodiments, the fourth node 108 may compare the two CRC sums (e.g., the third CRC sum and the first CRC sum received from the first node 102 via the received first update descriptor list), and request the changed data of the changed area 120 from the first node 102, because the CRC sums may be different. In some embodiments, once the changed data is received, the fourth node 108 may merge the changed data to the fourth object 118. In some embodiments, after merging the received changed data of the changed area 120 from the first node 102, the fourth object 118 on the fourth node 108 and the first object 112 on the first node 102 may be the same.

In some embodiments, after the time T2, the distributed system 100 may at a time T3, process a write request on the fourth node 108 that may change the fourth object 118. In some embodiments, the area affected by the write I/O request may be designated as a changed area 122.

In some embodiments, the fourth node 108 may evaluate the changed area 122 by using a delta compression algorithm to get the changed area 122 of the fourth object 118, including the starting point, length, and the CRC sum of the changed area 122 (e.g., a triple data entity). The triple data entity may be stored permanently in a fourth object update descriptor list on the fourth node 108, and the fourth node 108 may send the triple data entity to the first node 102.

In some embodiments, the first node 102 may receive the triple data entity from the fourth node 108, and save the triple data entity in the first object update descriptor list. The first node 102 may then calculate a new first CRC of the first object 112 based on the received triple data entity from the fourth node 108 for the changed area 122 and request the changed data of the changed area 122 from the fourth node 108. In some embodiments, once the changed data is received, the first node 102 may merge the changed data to the first object 112. In some embodiments, after merging the received changed data of the changed area 122 from the fourth node 108, both the first object 112 on the first node 102 and the fourth object 118 on the fourth node 108 may be the same.

In some embodiments, after the time T3, the distributed system 100 may, at a time T4, process a read I/O request to read the third object 116 on the third node 106. In some embodiments, the third node 116 may not have participated since the time T0 in any update of the first object 112 on the first node 102 (e.g., it may not have been read or modified since T0). The third node 106 may request the latest first object update descriptor list that the first node 102 has stored for the first object 112.

In some embodiments, the first node 102 may respond to the third node 106 with the latest first object update descriptor list because the third node 106 has received two updates since the time T0 (e.g., the changed area 120 at the time T1 and the changed area 122 at the time T3). The third node 106 may receive the first object update descriptor list from the first node 102, and store the first object update descriptor list. The third node 106 may calculate for each new triple data entity (e.g., from changed areas 120 and 122) in the first object update descriptor list a second CRC sum of the third object 116. Each time the second CRC sum and the first CRC sum of the first object 112 differs for the particular area (e.g., the changed areas 120 and 122), the third node 106 may request the changed data of the changed areas 120 and 122 of the first object 112 from the first node 102.

In some embodiments, the number of changes to an object, and hence the number of entries of the first object update descriptor list, can be numerous. In some embodiments, after receiving the changed data of the changed areas 120 and 122 from the first node 102, the third node 106 may merge the changed data to the third object 116. In some embodiments, after merging the changed data, the first object 112 on the first node 102 and the third object 116 on the third node 106 may be the same.

In some embodiments, after the time T4, the distributed system 100 may, at a time T5, process a read I/O request to read the second object 114 on the second node 104. The second node 104 may request the latest first object update descriptor list that the first node 102 has stored for the first object 112. The first node 102 may respond with the stored first object update descriptor list because it has received two updates since T0 (e.g., the changed area 120 at the time T1 and the changed area 122 at the time T3).

The second node 104 may receive the first object update descriptor list from the first node 102, and store the first update descriptor list. The second node 104 may calculate for each new triple data entity (e.g., from changed areas 120 and 122) in the first object update descriptor list a new first CRC of the second object 113. In some embodiments, each time the new first CRC of the particular area of the second object 114 and the first CRC of the first object 112 differ, the second node 104 may request the changed data (e.g., from the changed areas 120 and 122) of the first object 112 from the first node 102. In some embodiments, the second node 104 may request only the changed data of the changed area 122 because the new first CRC compare would not differ for the changed area 120. That is, the second node 104 may receive only the changed data of the change area 122 because the changed area 122 has not been seen by the second node 104 before.

Figure 2:
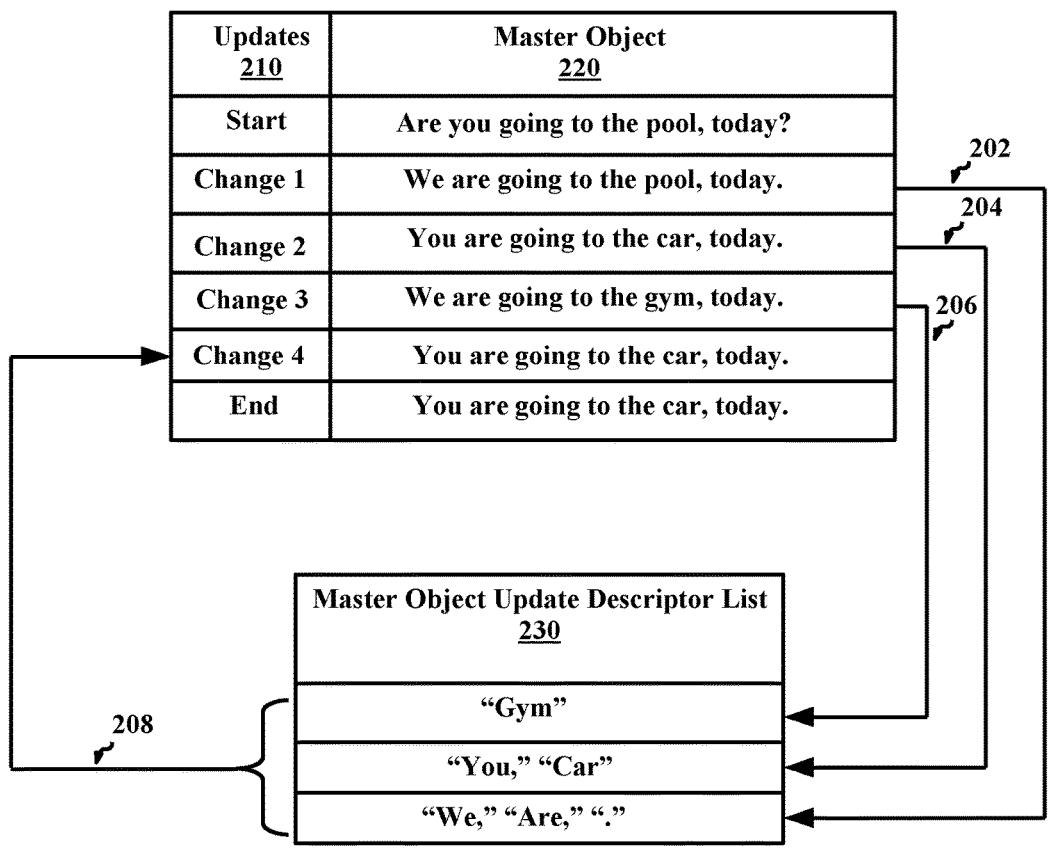
FIG. 2 illustrates an example master node being updated at a specific time, in accordance with embodiments of the present disclosure.

Referring now to FIG. 2, illustrated is an example master node 200 being updated at a specific time, in accordance with embodiments of the present disclosure. In some embodiments, the master node may include a chart of updates 210, a master object 220 that may be updated, and a master object update descriptor list 230 that may store minor changes. In some embodiments, the master node 200 may be a part of a storage system (e.g., a hard drive, a server, etc.). In some embodiments, the master object update descriptor list 230 may reduce inter-cluster communication by allowing each node in the clustered system to update only the changed data located in the list and not having to replace all data on the node.

In some embodiments, the master node 200 may start with the master object 220. For example, the master object 220 may be the original phrase "Are you going to the pool, today?" The master node 200 may then receive a first change (e.g., change 1 from a different node located in the same storage system as the master node) that may update the master object 220 to now read as "We are going to the pool, today." In some embodiments, the master node 200 may compare the original (e.g., update start) to the first change (e.g., change 1) and identify that the words "we," and "are" now appear in the master object 220, in addition to the punctuation mark "." (e.g., the question mark is now a period).

The master node may follow path 202 to transfer the changed words into the master object update descriptor list 230. In some embodiments, this may be done in order for the computer to more efficiently and quickly identify changes and update subsequent nodes in the clustered system. In some embodiments, the master node 200 may additionally receive a second change (e.g., change 2). The master node 200 may compare the second change and the first change and identify that the words "you," and "car" now appear in the second change of the master object 220. In some embodiments, the master node 200 may additionally analyze the master object update descriptor list 230 and identify that neither "you" nor "car" appear in the master object update descriptor list 230. The master node 200 may then update, following path 204, the master object update descriptor list 230 with "you" and "car."

In some embodiments, the master node 200 may receive a third change (e.g., change 3) to the master object 220. The master node may compare the third change and the second change and identify that the words "we" and "gym" now appear in the third change and that an actual change has occurred. In some embodiments, the master node 200 may additionally search the master object update descriptor list 230, and identify that the word "we" already exists in the master object update descriptor list 230, however the word "gym" does not. The master node 200 may then update the master object update descriptor list 230 following path 206 with just the word "gym."

In some embodiments, each change in the chart of updates 210 (e.g., change 1, change 2, change 3, and change 4) may be an index (e.g., indicator, tag, etc.), and each node in the clustered system may have its own update descriptor list with the indices. For example, on the third change, the word "gym" may be transferred between the nodes in the clustered system because "gym" has yet to appear on the master object update descriptor list 230. Additionally, the word "we" from the master object update descriptor list 230, which may be indexed as the first change (e.g., change 1), may be transferred to the third change.

In some embodiments, the master object update descriptor list 230 may allow other nodes in the clustered system to reproduce and change their respective objects in the same or a similar way (e.g., "we" and "gym"). That is, if an object is changed with change 3 (e.g., acting as an index) on a first node, the first node may send the word "gym" and "#change 1" (e.g., index change 1 or the word "we") to the master node 200 to update the master object 220 with "change 1" (e.g., "we") and "gym." This may allow nodes during subsequent changes to their respective objects to use the master object update descriptor list 230 to identify identical changed objects and reduce inter-cluster node communication for object updates by sending only the change index.

In some embodiments, the master node 200 may receive a fourth change (e.g., change 4) of the master object 220. The master node 200 may compare the fourth change with the third change, and identify that the words "you" and "car" now appear. In some embodiments, the master node 200 may additionally analyze the master object update descriptor list 230, and identify that both words "you" and "car" already exist in the master object update descriptor list 230. In some embodiments, the master node may take the words already in the master object update descriptor list 230, and update the fourth change, following path 208, with the words "you" and "car." This may be done in order to avoid unnecessarily copying the entire change to the master node 200. In some embodiments, the changes to the master object 220 in the master node 200 may end after the last (e.g., fourth change) has been updated.

In some embodiments, the end change of the master object 220 may be the version of the master object 220 that is compared to additional objects located in different nodes of the storage system. In some embodiments, the end version of the master object 220 may lead the different nodes of the storage system to the master object update descriptor list 230, which may update the outside objects in the different nodes with the likely missing words. In some embodiments, each node may have its own object update descriptor list that may be synchronized with the master object update descriptor list 230 in order to identify changes within objects in other nodes located in the clustered system.

Figure 3:
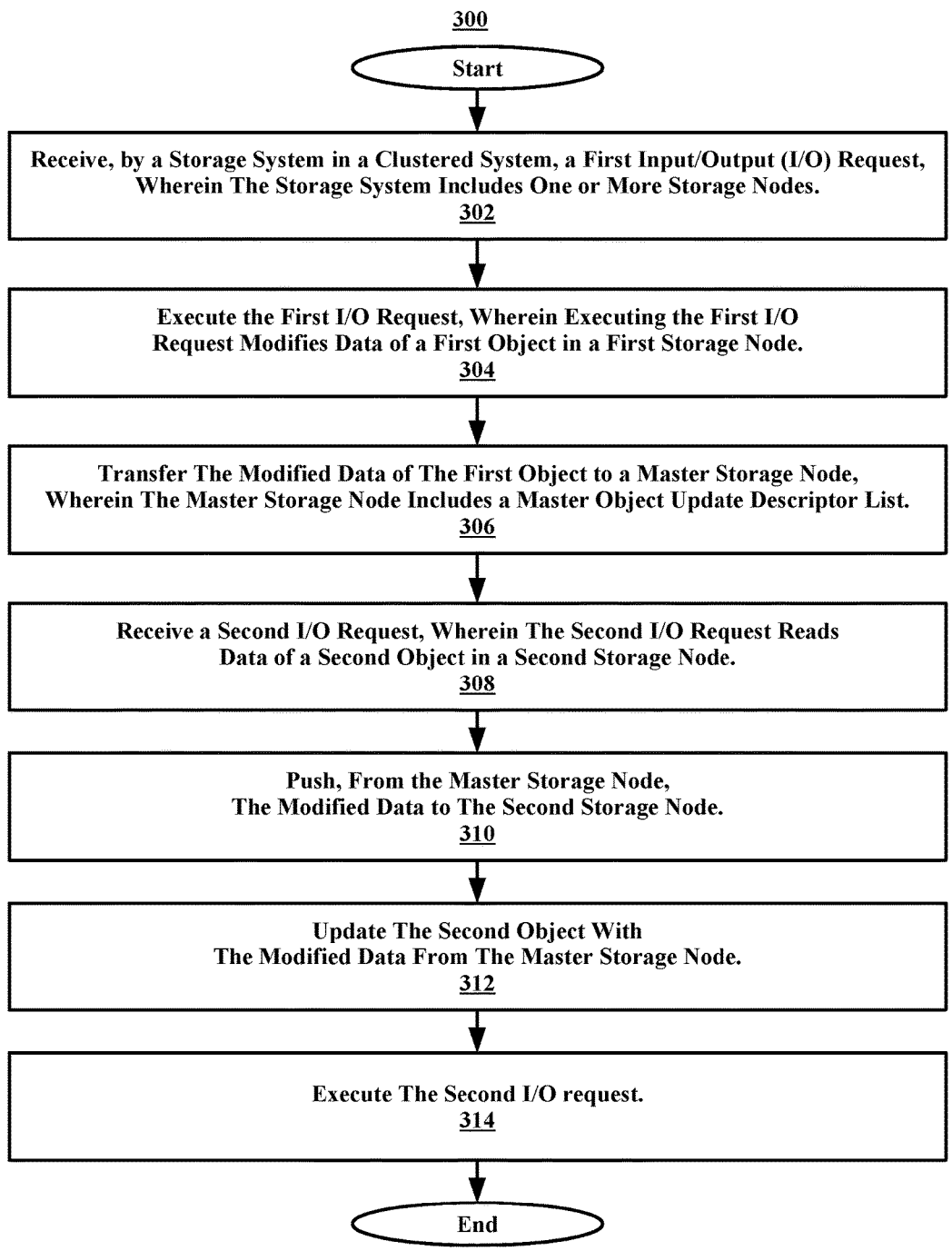
FIG. 3 illustrates a flowchart of an example method for updating a storage node that has received an I/O request, in accordance with embodiments of the present disclosure.

Referring now to FIG. 3, illustrated is a flowchart of an example method 300 for updating a storage node that has received an I/O request, in accordance with embodiments of the present disclosure. In some embodiments, a processor may perform the method 300. In some embodiments, a server may perform the method 300. In some embodiments, the method 300 may begin at operation 302.

At operation 302, a storage system in a clustered system (e.g., one or more devices connected together via a network) may receive a first I/O request. In some embodiments, the storage system may include one or more storage nodes. In some embodiments, each of the one or more storage nodes may have a copy of a particular object stored thereon. After receiving the first I/O request at operation 302, the method 300 may proceed to operation 304. At operation 304, the storage system may execute the first I/O request. In some embodiments, when the first I/O request is executed, the first I/O request may modify data (e.g., because the first I/O request may be a write I/O request) of a first object in a first storage node. In some embodiments, the first object may be a copy of the particular object.

After executing the first I/O request at operation 304, the method 300 may proceed to operation 306. At operation 306 the storage system may transfer the modified data of the first object to a master storage node. In some embodiments, the master storage node may include a master object update descriptor list. In some embodiments, the master object update descriptor list may store all new changes that have occurred to an object that do not already exist in the master object update descriptor list.

After transferring the modified data at operation 306, the method 300 may proceed to operation 308. At operation 308 the storage system may receive a second I/O request. In some embodiments, the second I/O request may read data of a second object in a second storage node. In some embodiments, the first object and the second object may be the same object (e.g., share the same data), and the first object and second object may need to be synchronized to remain consistently the same.

After receiving the second I/O request at operation 308, the method 300 may proceed to operation 310. At operation 310, the master storage node in the storage system may push the modified data to the second storage node. In some embodiments, the storage system may do this so the second storage node has the same object data as the first object node. After pushing the modified data to the second storage node at operation 310, the method 300 may proceed to operation 312.

At operation 312, the storage system may update the second object with the modified data from the master storage node. After updating the second object with the modified data at operation 312 in order for the second object to be synchronized with the first object, the method 300 may proceed to operation 314. At operation 314, the storage system may execute the second I/O request with the update data. After executing the second I/O request, the method 300 may end. In some embodiments, the method 300 may progress with more than two I/O requests, and repeat the updating and execution process for as may I/O requests as the storage system receives.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 4:
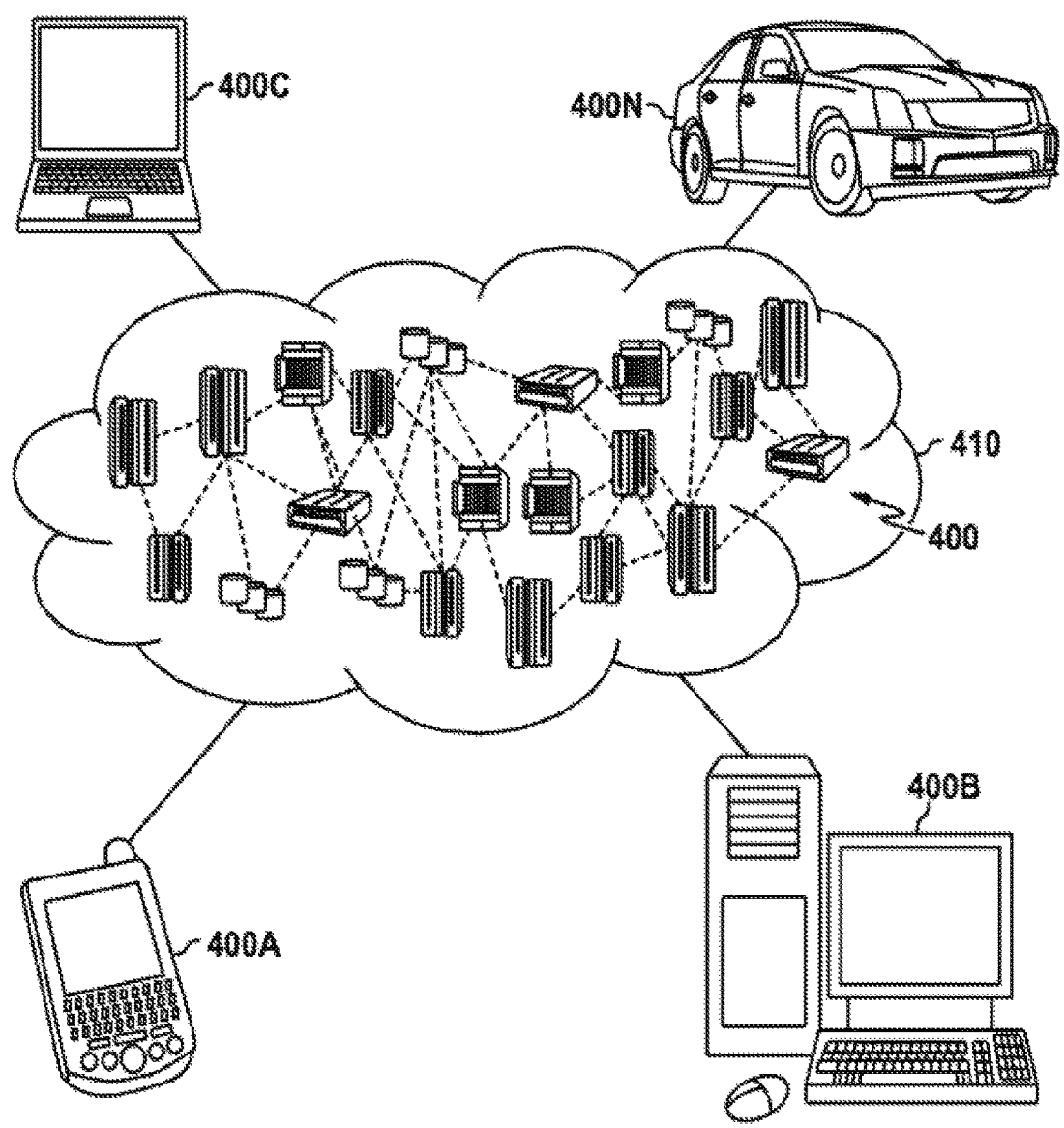
FIG. 4 depicts a cloud computing environment, in accordance with embodiments of the present disclosure.

Referring now to FIG. 4, illustrative cloud computing environment 410 is depicted. As shown, cloud computing environment 410 includes one or more cloud computing nodes 400 with which local computing devices used by cloud consumers, such as, for example, personal digital assistant (PDA) or cellular telephone 400A, desktop computer 400B, laptop computer 400C, and/or automobile computer system 400N may communicate. Nodes 400 may communicate with one another. They may be grouped (not shown) physically or virtually, in one or more networks, such as Private, Community, Public, or Hybrid clouds as described hereinabove, or a combination thereof. This allows cloud computing environment 410 to offer infrastructure, platforms and/or software as services for which a cloud consumer does not need to maintain resources on a local computing device. It is understood that the types of computing devices 400A-N shown in FIG. 4 are intended to be illustrative only and that computing nodes 400 and cloud computing environment 410 can communicate with any type of computerized device over any type of network and/or network addressable connection (e.g., using a web browser).

Figure 5:
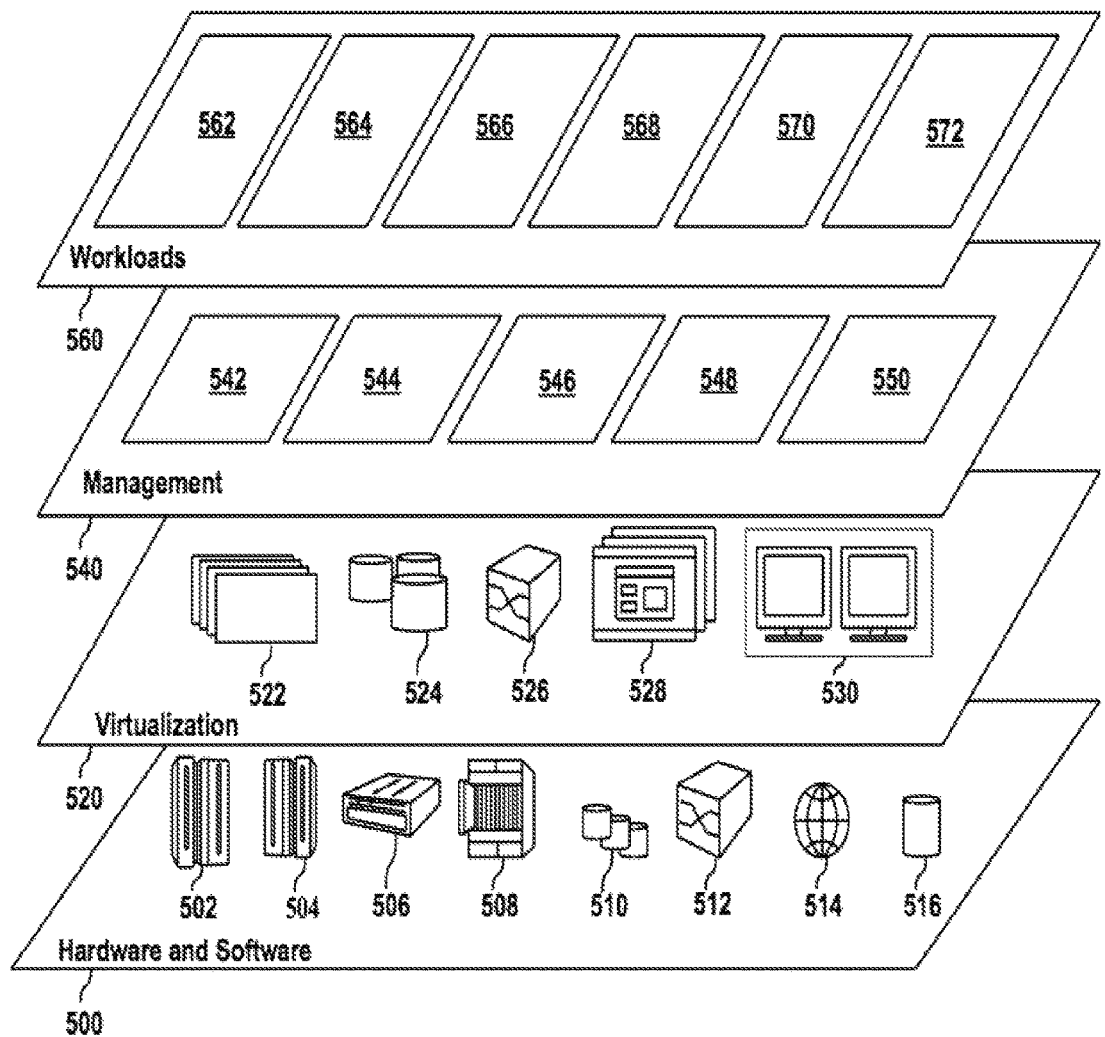
FIG. 5 depicts abstraction model layers, in accordance with embodiments of the present disclosure.

Referring now to FIG. 5, a set of functional abstraction layers provided by cloud computing environment 410 (FIG. 4) is shown. It should be understood in advance that the components, layers, and functions shown in FIG. 5 are intended to be illustrative only and embodiments of the invention are not limited thereto. As depicted below, the following layers and corresponding functions are provided.

Hardware and software layer 500 includes hardware and software components. Examples of hardware components include: mainframes 502; RISC (Reduced Instruction Set Computer) architecture based servers 504; servers 506; blade servers 508; storage devices 510; and networks and networking components 512. In some embodiments, software components include network application server software 514 and database software 516.

Virtualization layer 520 provides an abstraction layer from which the following examples of virtual entities may be provided: virtual servers 522; virtual storage 524; virtual networks 526, including virtual private networks; virtual applications and operating systems 528; and virtual clients 530.

In one example, management layer 540 may provide the functions described below. Resource provisioning 542 provides dynamic procurement of computing resources and other resources that are utilized to perform tasks within the cloud computing environment. Metering and Pricing 544 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 546 provides access to the cloud computing environment for consumers and system administrators. Service level management 548 provides cloud computing resource allocation and management such that required service levels are met. Service Level Agreement (SLA) planning and fulfillment 550 provide pre-arrangement for, and procurement of, cloud computing resources for which a future requirement is anticipated in accordance with an SLA.

Workloads layer 560 provides examples of functionality for which the cloud computing environment may be utilized. Examples of workloads and functions which may be provided from this layer include: mapping and navigation 562; software development and lifecycle management 564; virtual classroom education delivery 566; data analytics processing 568; transaction processing 570; and identifying an identifiable media 572.

Figure 6:
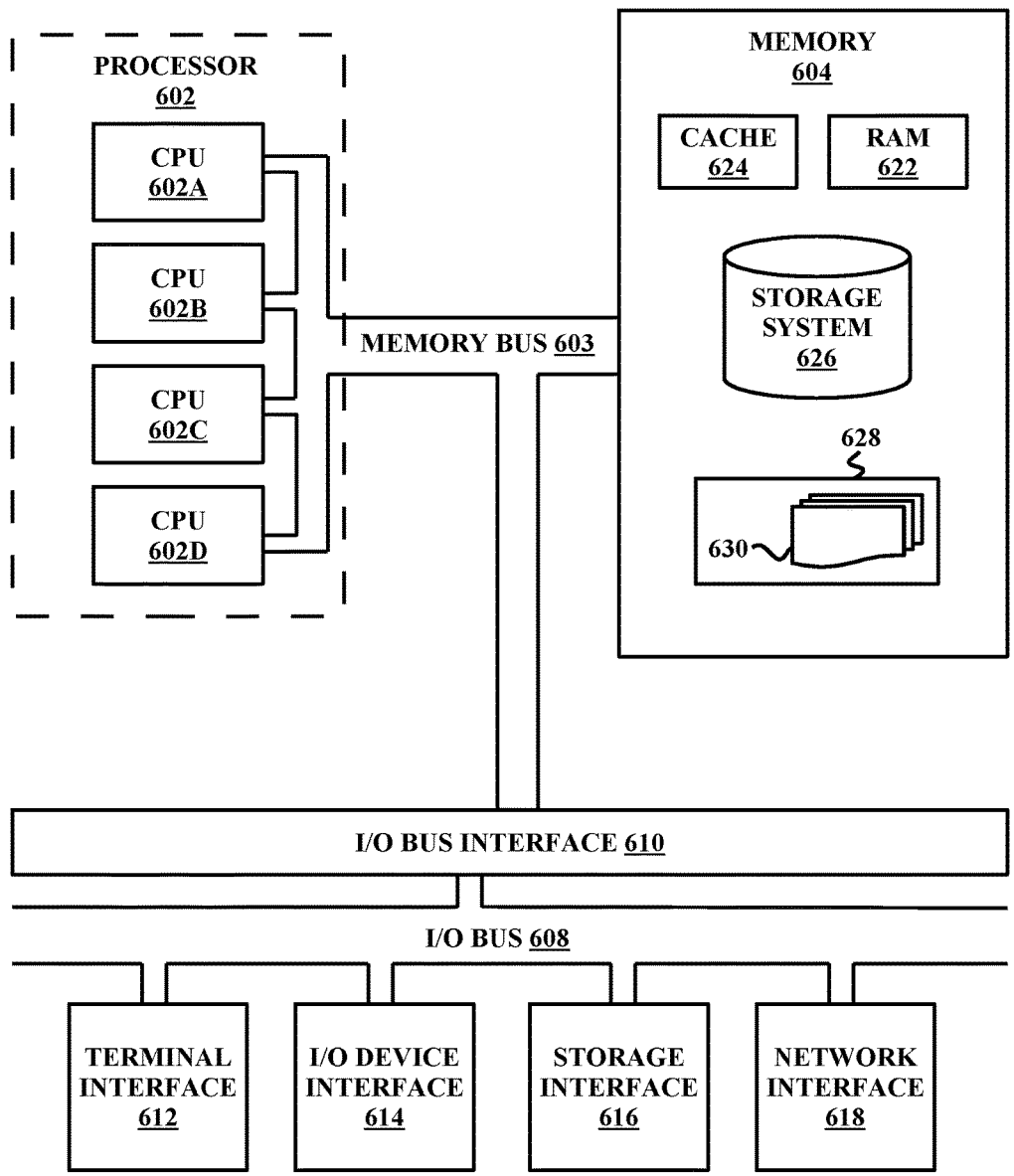
FIG. 6 illustrates a high-level block diagram of an example computer system that may be used in implementing one or more of the methods, tools, and modules, and any related functions, described herein, in accordance with embodiments of the present disclosure.

Referring now to FIG. 6, shown is a high-level block diagram of an example computer system 601 that may be used in implementing one or more of the methods, tools, and modules, and any related functions, described herein (e.g., using one or more processor circuits or computer processors of the computer), in accordance with embodiments of the present disclosure. In some embodiments, the major components of the computer system 601 may comprise one or more CPUs 602, a memory subsystem 604, a terminal interface 612, a storage interface 616, an I/O (Input/Output) device interface 614, and a network interface 618, all of which may be communicatively coupled, directly or indirectly, for inter-component communication via a memory bus 603, an I/O bus 608, and an I/O bus interface unit 610.

The computer system 601 may contain one or more general-purpose programmable central processing units (CPUs) 602A, 602B, 602C, and 602D, herein generically referred to as the CPU 602. In some embodiments, the computer system 601 may contain multiple processors typical of a relatively large system; however, in other embodiments the computer system 601 may alternatively be a single CPU system. Each CPU 602 may execute instructions stored in the memory subsystem 604 and may include one or more levels of on-board cache.

System memory 604 may include computer system readable media in the form of volatile memory, such as random access memory (RAM) 622 or cache memory 624. Computer system 601 may further include other removable/non-removable, volatile/non-volatile computer system storage media. By way of example only, storage system 626 can be provided for reading from and writing to a non-removable, non-volatile magnetic media, such as a "hard-drive." Although not shown, a magnetic disk drive for reading from and writing to a removable, non-volatile magnetic disk (e.g., a "floppy disk"), or an optical disk drive for reading from or writing to a removable, non-volatile optical disc such as a CD-ROM, DVD-ROM or other optical media can be provided. In addition, memory 604 can include flash memory, e.g., a flash memory stick drive or a flash drive. Memory devices can be connected to memory bus 603 by one or more data media interfaces. The memory 604 may include at least one program product having a set (e.g., at least one) of program modules that are configured to carry out the functions of various embodiments.

One or more programs/utilities 628, each having at least one set of program modules 630 may be stored in memory 604. The programs/utilities 628 may include a hypervisor (also referred to as a virtual machine monitor), one or more operating systems, one or more application programs, other program modules, and program data. Each of the operating systems, one or more application programs, other program modules, and program data or some combination thereof, may include an implementation of a networking environment. Programs 628 and/or program modules 630 generally perform the functions or methodologies of various embodiments.

Although the memory bus 603 is shown in FIG. 6 as a single bus structure providing a direct communication path among the CPUs 602, the memory subsystem 604, and the I/O bus interface 610, the memory bus 603 may, in some embodiments, include multiple different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface 610 and the I/O bus 608 are shown as single respective units, the computer system 601 may, in some embodiments, contain multiple I/O bus interface units 610, multiple I/O buses 608, or both. Further, while multiple I/O interface units are shown, which separate the I/O bus 608 from various communications paths running to the various I/O devices, in other embodiments some or all of the I/O devices may be connected directly to one or more system I/O buses.

In some embodiments, the computer system 601 may be a multi-user mainframe computer system, a single-user system, or a server computer or similar device that has little or no direct user interface, but receives requests from other computer systems (clients). Further, in some embodiments, the computer system 601 may be implemented as a desktop computer, portable computer, laptop or notebook computer, tablet computer, pocket computer, telephone, smart phone, network switches or routers, or any other appropriate type of electronic device.

It is noted that FIG. 6 is intended to depict the representative major components of an exemplary computer system 601. In some embodiments, however, individual components may have greater or lesser complexity than as represented in FIG. 6, components other than or in addition to those shown in FIG. 6 may be present, and the number, type, and configuration of such components may vary.

As discussed in more detail herein, it is contemplated that some or all of the operations of some of the embodiments of methods described herein may be performed in alternative orders or may not be performed at all; furthermore, multiple operations may occur at the same time or as an internal part of a larger process.

The present invention may be a system, a method, and/or a computer program product. The computer program product may include a non-transitory computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers, and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present invention has been described in terms of specific embodiments, it is anticipated that alterations and modification thereof will become apparent to the skilled in the art. Therefore, it is intended that the following claims be interpreted as covering all such alterations and modifications as fall within the true spirit and scope of the invention.

What is claimed is:

1. A computer-implemented method comprising: receiving, by a storage system in a clustered system, a first input/output (I/O) request, wherein the storage system includes one or more storage nodes, each of the one or more storage nodes having a copy of a particular object stored thereon; executing the first I/O request, wherein executing the first I/O request modifies data of a first object in a first storage node, the first object being a copy of the particular object; and transferring the modified data of the first object to a master storage node, wherein the master storage node includes a master object update descriptor list; wherein transferring the modified data of the first object to the master storage node comprises: receiving a notification from the first storage node that data of the first object has been modified; comparing original data on the master storage node to the modified data of the first object; identifying one or more differences between the original data and the modified data of the first object; and storing the one or more differences in the master object update descriptor list; wherein comparing the original data on the master storage node to the modified data of the first object further comprises: calculating a cyclic redundancy check (CRC) sum, a starting point, and a length of a modified data area of the first object; storing the CRC sum, the starting point, and the length of the modified data area of the first object permanently in a first object descriptor list, wherein the CRC sum, the starting point, and the length of the modified data area are permanently stored by exclusively adding one or more identified changes of the first object to the first object descriptor list and not deleting the one or more identified changes of the first object; and sending the CRC sum, the starting point, and the length of the modified data area of the first object to the master storage node.

2. The method of claim 1, further comprising:
receiving a second I/O request, wherein the second I/O request reads data of a second object in a second storage node;
pushing, from the master storage node, the modified data to the second storage node;
updating the second object with the modified data from the master storage node; and
executing the second I/O request.

3. The method of claim 2, further comprising:
requesting, upon receiving the second I/O request, the modified data from the master storage node;
identifying, from the master object update descriptor list, modified data of each of the one or more storage nodes, including the modified data of the first storage node;
queuing, in reverse-chronological order on the master object update descriptor list, the modified data of each of the one or more storage nodes, wherein the modified data of the first storage node is stored as a last entry in the master object update descriptor list; and
transferring, based on the queuing, the modified data of each of the one or more storage nodes to the second storage node.

4. The method of claim 2, further comprising:
receiving a third I/O request, wherein the third I/O request modifies data of a third object in a third storage node; requesting the modified data from the master storage node;
comparing the modified data from the master storage node to the modified data of the third I/O request;
determining, based on the comparing, one or more data differences between the modified data from the master storage node and the modified data of the third I/O request;
updating the third object with the one or more data differences; and
executing the third I/O request.

5. The method of claim 4, further comprising:
determining, in response to comparing the modified data from the master storage node to the modified data of the third I/O request, that the modified data from the master storage node exceeds a threshold number of changes; and
copying all data from the master storage node to the third object, wherein copying all the data from the master storage node to the third object includes replacing the data of the third object with the modified data and one or more unmodified data on the master storage node.

6. A system comprising: a memory; and a processor in communication with the memory, the processor being configured to perform operations comprising: receiving, by a storage system in a clustered system, a first input/output (I/O) request, wherein the storage system includes one or more storage nodes, each of the one or more storage nodes having a copy of a particular object stored thereon; executing the first I/O request, wherein executing the first I/O request modifies data of a first object in a first storage node, the first object being a copy of the particular object; and transferring the modified data of the first object to a master storage node, wherein the master storage node includes a master object update descriptor list; wherein transferring the modified data of the first object to the master storage node comprises: receiving a notification from the first storage node that data of the first object has been modified; comparing original data on the master storage node to the modified data of the first object; identifying one or more differences between the original data and the modified data of the first object; and storing the one or more differences in the master object update descriptor list; wherein comparing the original data on the master storage node to the modified data of the first object further comprises: calculating a cyclic redundancy check (CRC) sum, a starting point, and a length of a modified data area of the first object; storing the CRC sum, the starting point, and the length of the modified data area of the first object permanently in a first object descriptor list, wherein the CRC sum, the starting point, and the length of the modified data area are permanently stored by exclusively adding one or more identified changes of the first object to the first object descriptor list and not deleting the one or more identified changes of the first object; and sending the CRC sum, the starting point, and the length of the modified data area of the first object to the master storage node.

7. The system of claim 6, further comprising:
receiving a second I/O request, wherein the second I/O request reads data of a second object in a second storage node;
pushing, from the master storage node, the modified data to the second storage node;
updating the second object with the modified data from the master storage node; and
executing the second I/O request.

8. The system of claim 7, further comprising:
receiving a third I/O request, wherein the third I/O request modifies data of a third object in a third storage node;
requesting the modified data from the master storage node;
comparing the modified data from the master storage node to the modified data of the third I/O request;
determining, based on the comparing, one or more data differences between the modified data from the master storage node and the modified data of the third I/O request;
updating the third object with the one or more data differences; and
executing the third I/O request.

9. The system of claim 6, wherein comparing the original data on the master storage node to the modified data of the first object further comprises: calculating a master cyclic redundancy check (CRC) sum, a master starting point, and a master length of a modified data area of a master object; comparing the master CRC sum to the CRC sum, the master starting point to the starting point, and the master length to the length of the modified data area of the first object; identifying one or more differences between the master CRC sum and the CRC sum, the master starting point and the starting point, and the master length and the length of the modified data area of the first object; and storing the one or more differences in the master object update descriptor list.

10. The system of claim 8, further comprising:
determining, in response to comparing the modified data from the master storage node to the modified data of the third I/O request, that the modified data from the master storage node exceeds a threshold number of changes; and
copying all data from the master storage node to the third object, wherein copying all the data from the master storage node to the third object includes replacing the data of the third object with the modified data and one or more unmodified data on the master storage node.

11. A computer program product comprising a non-transitory computer readable storage medium having program instructions embodied therewith, the program instructions executable by a processor to cause the processor to perform a method, the method comprising: receiving, by a storage system in a clustered system, a first input/output (I/O) request, wherein the storage system includes one or more storage nodes, each of the one or more storage nodes having a copy of a particular object stored thereon; executing the first I/O request, wherein executing the first I/O request modifies data of a first object in a first storage node, the first object being a copy of the particular object; and transferring the modified data of the first object to a master storage node, wherein the master storage node includes a master object update descriptor list; wherein transferring the modified data of the first object to the master storage node comprises: receiving a notification from the first storage node that data of the first object has been modified; comparing original data on the master storage node to the modified data of the first object; identifying one or more differences between the original data and the modified data of the first object; and storing the one or more differences in the master object update descriptor list; wherein comparing the original data on the master storage node to the modified data of the first object further comprises: calculating a cyclic redundancy check (CRC) sum, a starting point, and a length of a modified data area of the first object; storing the CRC sum, the starting point, and the length of the modified data area of the first object permanently in a first object descriptor list, wherein the CRC sum, the starting point, and the length of the modified data area are permanently stored by exclusively adding one or more identified changes of the first object to the first object descriptor list and not deleting the one or more identified changes of the first object; and sending the CRC sum, the starting point, and the length of the modified data area of the first object to the master storage node.

12. The computer program product of claim 11, further comprising:
receiving a second I/O request, wherein the second I/O request reads data of a second object in a second storage node;
pushing, from the master storage node, the modified data to the second storage node;
updating the second object with the modified data from the master storage node; and
executing the second I/O request.

13. The computer program product of claim 12, further comprising:
receiving a third I/O request, wherein the third I/O request modifies data of a third object in a third storage node;
requesting the modified data from the master storage node;
comparing the modified data from the master storage node to the modified data of the third I/O request;
determining, based on the comparing, one or more data differences between the modified data from the master storage node and the modified data of the third I/O request;
updating the third object with the one or more data differences; and
executing the third I/O request.

14. The computer program product of claim 11, wherein comparing the original data on the master storage node to the modified data of the first object further comprises: calculating a master cyclic redundancy check (CRC) sum, a master starting point, and a master length of a modified data area of a master object; comparing the master CRC sum to the CRC sum, the master starting point to the starting point, and the master length to the length of the modified data area of the first object; identifying one or more differences between the master CRC sum and the CRC sum, the master starting point and the starting point, and the master length and the length of the modified data area of the first object; and storing the one or more differences in the master object update descriptor list.

* * * * *